SEMICONDUCTOR INTEGRATED CIRCUITS

Filed July 25, 1968 5 Sheets-Sheet 1

INVENTORS
TONY C. DENTON
GERALD D. BERGMAN
BY
AGENT

INVENTORS
TONY C. DENTON
GERALD D. BERGMAN
BY
Frank R. Trifari
AGENT

SEMICONDUCTOR INTEGRATED CIRCUITS
Filed July 25, 1968 5 Sheets-Sheet 3
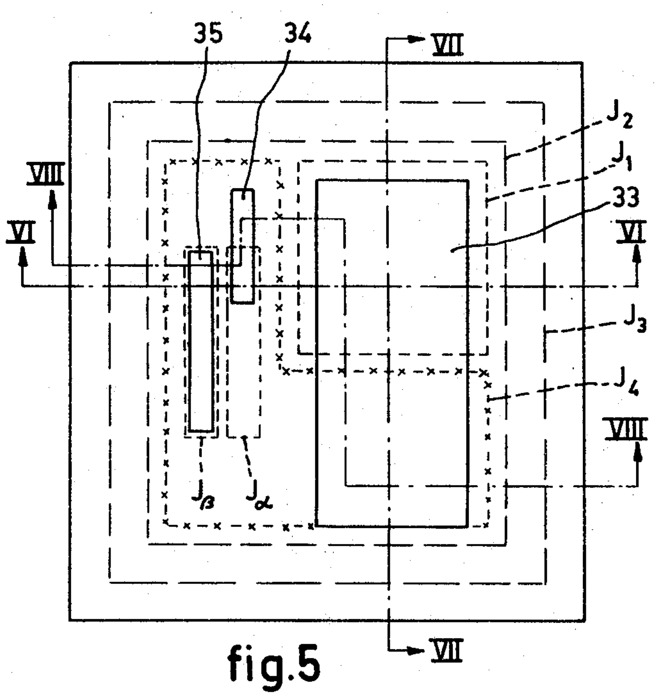
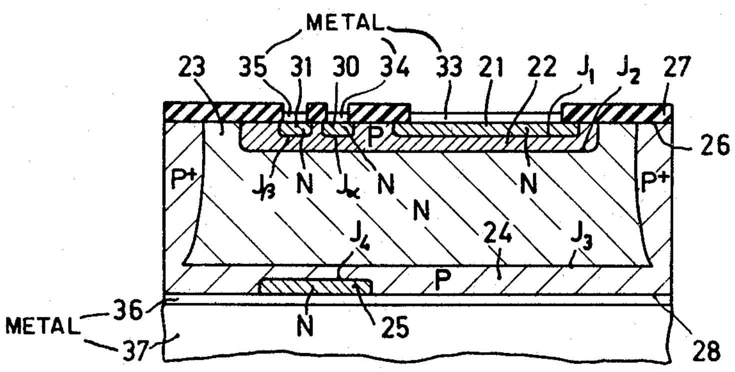
fig.6
INVENTORS.
TONY C. DENTON
GERALD D. BERGMAN
BY
Frank R. Trifari
AGENT April 21, 1970 G. D. BERGMAN ET AL 3,508,127

SEMICONDUCTOR INTEGRATED CIRCUITS

Filed July 25, 1968 5 Sheets-Sheet 4

INVENTORS
TONY C. DENTON
GERALD D. BERGMAN

BY

Frank R. Jifani

AGENT

INVENTORS
TONY C. DENTON
GERALD D. BERGMAN
BY
Frank R. Trifari
AGENT

United States Patent Office 3,508,127

Patented Apr. 21, 1970

3,508,127

SEMICONDUCTOR INTEGRATED CIRCUITS

Gerald David Bergman, Bushey Heath, and Tony C. Denton, Watford, England, assignors, by mesne assignments, to U.S. Philips Corporation, New York, N.Y., a corporation of Delaware Filed July 25, 1968, Ser. No. 747,654

Claims priority, application Great Britain, Aug. 9, 1967, 36,515/67

Int. Cl. H01l *11/00, 9/00*

U.S. Cl. 317—235 7 Claims

ABSTRACT OF THE DISCLOSURE

A semiconductor integrated circuit of the planar type comprising a transverse 4-layer or 5-layer thyristor having in a middle base region a lateral 3-layer trigger diode for turning the thyristor on. The trigger diode includes a shorted junction. The entire circuit can be made by standard diffused planar technology.

This invention relates to a semiconductor integrated circuit comprising a semiconductor body having a transverse thyristor formed by first, second, third and fourth successively arranged regions of alternating conductivity type extending between opposite major surfaces of the body and defining three p-n junctions therebetween, two main current carrying electrodes, one in ohmic contact with the first region of the one conductivity type (n or p) at one major surface and the other in ohmic contact with the fourth region which is of the opposite conductivity type (p or n) whereby a main current carrying path is provided between said electrodes through the transverse thyristor formed by said four regions and said three p-n junctions, the first region which is of the one conductivity type (n or p) being surrounded within the body by the second region which is of the opposite conductivity type (p or n) with the p-n junction therebetween terminating at the one surface.

Semiconductor devices comprising a semiconductor body having four successively arranged regions of alternating conductivity type defining three p-n junctions therebetween and electrodes on the outer two regions are known. Such two-terminal devices may be referred to as diode thryistors. A further development of such devices is the gate controlled thryistor in which a third, gate electrode is present on one of the two intermediate regions. These devices may be referred to as triode thyristors. In the operation of these devices a relatively small voltage applied at the gate electrode can switch the device from a high impedance, non-conductive state to a low impedance, conductive state, when a suitable forward voltage is applied between the electrodes on the outer two regions. A small current applied to the gate electrode initiates the flow of a much greater current through the device between the main current carrying electrodes on the outer two regions. These devices are unidirectional in that with alternating current applied cross the main current carrying electrodes the device can exist in the low impedance, conductive state only in one half cycle of the applied alternating current. Bidirectional thyristors have been developed in which the device can exist in the low impedance, conductive state in both half cycles of the applied alternating current. These devices comprise a semiconductor body having five successively arranged regions of alternating conductivity type defining four p-n junctions therebetween, the first and fifth regions being of the same conductivity type arranged on opposite sides of the body and displaced relative to each other in the lateral direction of the body, the two main current carrying electrodes being situated on opposite sides of the body and respectively forming a common contact to the first and second regions and a common contact to the fourth and fifth regions. These devices may be referred to as bidirectional diode thyristors and when they further include a gate electrode on at least one of the intermediate regions, they are referred to as bidirectional triode thryistors or "Triacs."

There are various particular configurations of the four region diode and triode thyristors and various different methods are employed in their manufacture. One such configuration is the so-called "planar" thyristor. In this device the semiconductor body has at least one substantially plane major surface, the first region is a diffused region of the one conductivity type extending in the body from the one surface and is surrounded within the body by the second region of the opposite conductivity type with the p-n junction therebetween terminating at the one surface, the second region of the opposite conductivity type is a diffused region extending in the body from the one surface and is surrounded within the body by the third region of the one conductivity type with the p-n junction therebetween terminating at the one surface. A first main current carrying electrode is in low resistance ohmic contact with the first region at an exposed surface portion thereof and a second main current carrying electrode is in low resistance ohmic contact with a surface portion of the fourth region. In the triode thyristor a gate electrode is in low resistance ohmic contact with the second region at an exposed surface portion thereof. The planar thyristor is manufactured by the known techniques of the planar process which involves the steps of oxide masking, photoengraving, diffusion, metalisation, etc. This process permits a plurality of thyristor units to be produced simultaneously on a single wafer of semiconductor material, the semiconductor bodies of individual devices being obtained from the wafer by dicing at a stage in manufacture after the diffusion and metalisation have been carried out. In the manufacture of a silicon planar thyristor the starting material may be an n-type wafer of silicon. So-called p-type isolation diffusions are carried out such that a p-type grid extends completely through the body and defines the areas at which the individual thyristors are to be formed. The p-type isolation diffusion may be effected in a two-stage process, the p-type second and fourth regions being formed simultaneously during the second stage. The p-type second region is located between the grid extending to a limited surface area of one plane surface of the wafer. This is achieved by providing an insulating masking layer on the one surface having an opening therein exposing a portion of the surface into which the impurity is diffused. The opposite surface is not masked and the p-type fourth region is formed extending across the opposite surface contiguous with the p-type isolation diffusion grid. The n-type first region is subsequently formed within the previously formed p-type second region by diffusion of a donor impurity into a limited portion of the one surface exposed by a further opening in the insulating layer. By suitable modification of this process the five layer bidirectional thyristor can be formed.

Planar thyristors have applications, for example, in the speed control of small motors employed in domestic appliances and in some power control circuits. To obtain the desired control additional circuitry has to be provided in combination with the thyristor. A commonly employed D.C. motor speed control circuit employs a gate controlled thyristor, triode thyristor) in series with the motor and supply with a trigger circuit which is responsive to the motor speed connected to the gate. A simple trigger circuit may comprise an auxiliary diode thyristor in series with the gate of the main triode thyristor. Another circuit comprises a two-terminal, three layer trigger diode in series with the gate of the main triode thyristor. Such a diode may have symmetrical characteristics and is sometimes referred to a "Diac." Another circuit comprises a transistorised blocking oscillator trigger unit which triggers the gate of the main triode thyristor. In another circuit the D.C. motor is connected in series with the thyristor across the A.C. supply, a variable resistor being connected in parallel with the motor and thyristor, the gate of the triode thyristor being connected to a set point on the variable resistor. Triggering of the thyristor is according to the voltage difference between the set point and the feedback speed voltage generated by the armature of the motor appearing at the cathode of the thyristor. To prevent current flowing through the motor windings via the gate of the thyristor when the thyristor is in the non-conductive state and the voltage at the set point is more negative with respect to the feedback speed voltage generated by the armature of the motor, appearing at the cathode than the reverse breakdown voltage between the gate catode, a safety diode is connected between the gate and the set point on the variable resistor.

Bidirectional thyristors similarly have applications in motor speed control circuits and in power control circuits. A commonly employed circuit comprises a bidirectional triode thyristor ("Triac") which is triggered by a two terminal, three layer diode or "Diac" connected in series with the gate of the "Triac."

It is recognised tht the complexity of the necessary additional circuitry increase the cost of using thyristor motor speed control and power control systems. This invention is based on the recognition, inter alia, that by imple modifications of the processing employed in the manufacture of a planar type of thyristor, various integrated circuits comprising a thyristor and including at least one of the active circuit components of the additional triggering circuitry required when a thyristor is used, for example in motor speed control and power control can be manufactured at a cost for such as integrated circuit which is not significantly greater than that of a single planar thyristor.

According to the invention, a semiconductor integrated circuit comprising a semiconductor body having a transverse thyristor formed by first, second, third and fourth successively arranged regions of alternating conductivity type extending betwen opposite major surfaces of the body and defining three p-n junctions therebetween, two main current carrying electrodes, one in ohmic contact with the first region of the one conductivity type (n or p) at one major surface and the other in ohmic contact with the fourth region which is of the opposite conductivity type (p or n), whereby a main current carrying path is provided between said electrodes through the transverse thyristor formed by said four regions and said three p-n junctions, the first region which is of the one conductivity type (n or p) being surrounded within the body by the second region which is of the opposite conductivity type (p or n) with the p-n junction therebetween terminating at the one surface is characterized in that, first and second further regions of the one conductivity type (n or p) are provided which extending in the body from the one surface and are both surrounded within the body by the second region which is of the opposite conductivity type (p or n) with the p-n junctions therebetween also terminating at the one surface, the p-n junction between the first further region and the second region along part of its periphery which terminates at the one surface being shortened by a metal layer on the one surface, and a control electrode being provided in ohmic contact with the second further region at the one surface thereby to provide a lateral, three layer trigger diode in the series path from the control electrode to the second region of the transverse thyristor for switching the transverse thyristor from a high-impedance non-conductive state to a low-impedance, conductive state at a suitable applied voltage on the control electrode with respect to the applied voltage on the main current carrying electrode in ohmic contact with the first region.

In preferred constructions of the semiconductor integrated circuit according to the invention, the first region which is of the one conductivity type (n or p) is a diffused region, the second region which is of the opposite conductivity type (p or n) is a diffused region and is surrounded within the body by the third region which is of the one conductivity type (n or p) with the p-n junction therebetween terminating at the one surface. These constructions embody the features of the so-called "planar" thyristors as hereinbefore described.

In one preferred form of such a planar construction the first region which is of the one conductivity type (n or p) and the first and second further regions which are of the one conductivity type (n or p) are all diffused regions having substantially the same impurity concentration profiles and have been formed simultaneously by the diffusion of an element characteristic of the one conductivity type into limited surface portions of the one major surface. It will be apparent that such an integrated circuit may be manufactured in a similar manner to a planar type of thyristor, as hereinbefore described, by suitable modification of the photo-processing steps required to expose surface portions of the body prior to the diffusion of an element characteristic of the one conductivity type into the one major surface of the body, that is by suitable modification of the masks used in the exposure of a photoresist layer provided on an insulating layer on the one major surface. Thereafter at a later stage of manufacture the masks are suitably modified such that a control electrode is provided on the surface portion of the second further region of the one conductivity type (n or p) whereas in the manufacture of a planar type of thyristor the control electrode corresponds to the gate electrode of such a thyristor which would be provided on the second region. The masks are also suitably modified to form an opening in the insulating layer exposing the said part of the periphery of the p-n junction between the first further region which is of the one conductivity type (n or p) and the second region which is of the opposite conductivity type (p or n) where said part of the periphery terminates at the one surface. Thus the manufacture of such an integrated circuit does not necessarily involve additional diffusion steps and it will be apparent that by the modification of the manufacture of a planar thyristor as previously described it is feasible to produce a semiconductor integrated circuit according to the invention which includes a transverse thyristor and a lateral, three-layer triggering diode at a cost which is not substantially greater than the cost of manufacture of a single planar thyristor.

In the said planar constructions of the integrated circuit the third region which is of the one conductivity type (n or p) may be surrounded within the body by the fourth region which is of the opposite conductivity type (p or n) with the p-n junction therebetween terminating at the one major surface, said fourth region being a diffused region and extending to the opposite major surface of the body.

The main current carrying electrode in ohmic contact with the fourth region of the thysistor will generally be situated at the major surface of the body opposite the said one major surface. This provides for suitable heat dissipation from the transverse thyrsistor and also serves to support the body in a suitable encapsulation. However, it is possible, for example in some low current integrated circuits according to the invention, to locate the main current carrying electrode which is in ohmic contact with the fourth region at the one major surface where this region extend to said surface.

In further preferred forms of the integrated circuit the first and second further regions, which are of the one conductivity type (n or p), have substantially the same area at the one surface and have substantially the same impurity concentration profiles such that the lateral, three-layer trigger diode has substantially symmetrical characteristics.

In one form of an integrated circuit according to the invention, the transverse thyristor is a bidirectional thyristor, the semiconductor body comprising a fifth region which is of the one conductivity type (n or p), extends in the body from the major surface opposite to the said one major surface and is surrounded within the body by the fourth region which is of the opposite conductivity type (p or n) with the p-n junction therebetween terminating at the said opposite major surface, the first and fifth regions which are of the one conductivity type (n or p) being displaced relative to each other in the lateral direction of the body and the fifth region having a portion extending opposite the first and second further regions which are of the one conductivity type (n or p), the one main current carrying electrode forming a common contact to the first and second regions at adjoining exposed portions thereof at the one major surface and the other main current carrying electrode forming a common contact to the fourth and fifth regions at adjoining exposed portions thereof at the opposite major surface. Such a circuit thus comprises a transverse bidirectional thyristor and a lateral, three-layer trigger diode and has applications, for example, in lamp dimming and motor speed control circuits.

Embodiments of the invention will now be described by way of example, with reference to the accompanying diagrammatic drawings, in which:

FIGURES 5 to 8 show in plan view and three-sectional views respectively the semiconductor body of a second embodiment of a semiconductor integrated circuit, FIGURES 6, 7 and 8 being the sections along the line VI—VI, VII—VII, and VIII—VIII respectively of FIGURE 5;

Figure 1:
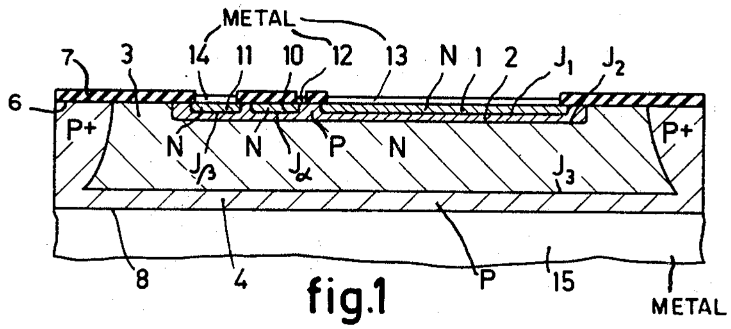
FIGURES 1 and 2 show in section and plan view respectively the semiconductor body of a first embodiment of a semiconductor integrated circuit.
Figure 2:
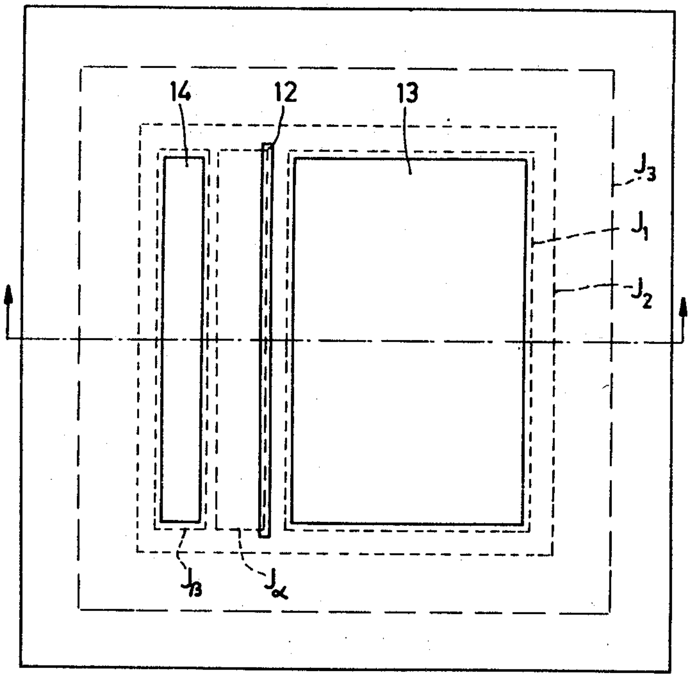

The semiconductor integrated circuit shown in FIGURES 1 and 2 comprises a semiconductor body of silicon having a first, n-type region 1, a second, p-type region 2, a third, n-type region 3 and a fourth, p-type region 4, extending between opposite major surfaces of the body and refining p-n junctions $J_1$, $J_2$ and $J_3$ therebetween. The semiconductor body has a substantially plane surface 6 having an adherent protective insulating layer 7 of silicon oxide thereon. The first, n-type region 1 is a diffused region and is surrounded within the body by the second, p-type region 2 which is also a diffused region. The p-n junction $J_1$ between the first and second regions terminates at the surface 6 below the silicon oxide layer 7. The second, p-type region 2 is surrounded within the body by the third, n-type region 3, the p-n junction $J_2$ between these regions also terminating at the surface 6 below the silicon oxide layer 7. The fourth, p-type region 4 is a diffused region and extends in the body from the opposite substantially plane surface 8. The region 4 further extends to the surface 6 at the periphery of the body such that the p-n junction $J_3$ between the third and fourth regions 3 and 4 respectively also terminates at the surface 6 below the silicon oxide layer 7.

First and second further regions 10 and 11 which are diffused n-type regions extend in the body from the surface 6 and are each surrounded within the body by the second p-type region 2 with the p-n junctions $J_\alpha$ and $J_\beta$ between these regions and the region 2 both terminating at the surface 6. In the insulating layer 7 there is an opening exposing part of the periphery of the p-n junction $J_\alpha$ where it terminates at the surface 6. This opening contains a metal layer stripe 12 which effectively shorts the said part of the periphery of the p-n junction $J_\alpha$. In further openings in the insulating layer 7 exposing the first, n-type region 1 and the second, further n-type region 11 where these regions extend to the surface 6, there are metal layers 13 and 14 which form low resistance ohmic contacts to the n-type regions 1 and 11 respectively. The semiconductor body is mounted with the surface 8 secured to a metal support 15 which forms a low resistance ohmic contact to the fourth p-type region 4.

The dimensions of the semiconductor body and the various regions shown in FIGURES 1 and 2 are as follows:

The body is of 2.23 mm. x 2.23 mm. x 180 microns thickness. The n-type region 3 has a resistivity of approximately 25 ohm-cm. and its area extending at the surface 6 is 1.83 mm. x 1.83 mm. The p-type region 4 has been formed by a two-stage boron diffusion process and the surface concentration at the surfaies 6 and 8 is $10^{19}$ atoms/cc. The junction $J_3$ is at a distance from the surface 8 of 30 microns. The junction $J_2$ extends substantially parallel to the surface 6 at a distance therefrom of 30 microns. The p-type region 2 contains a diffused boron concentration which at the surface 6 is $10^{19}$ atoms/cc. and the area of this region at the surface 6 is 1.43 mm. x 1.43 mm. The n-type regions 1, 10 and 11 all have the same diffused phosphorus concentrations, which at the surface 6 is $5\times10^{20}$ atoms/cc. The n-type region 1 has an area at the surface 6 of 0.85 mm. x 1.30 mm. The n-type regions 10 and 11 have the same areas at the surface 6, each of 0.18 mm. x 1.30 mm. The parts of the junctions $J_1$, $J_\alpha$ and $J_\beta$ extending substantially parallel to the surface 6 are at a distance therefrom of 15 microns. The adjoining parts of the junctions $J_\alpha$ and $J_\beta$ where they terminate at the surface 6 are spaced by a distance of 25 microns. The adjoining parts of the junctions $J_1$ and $J_\alpha$ where they terminate at the surface 6 are spaced by a distance of 60 microns. The aluminium contact layer 12 has an area of 0.80 mm. x 1.25 mm. and the aluminium contact layer 14 has an area of 0.14 mm. x 1.26 mm. The shorting aluminium layer 13 has an area of 30 microns x 1.34 mm. The aluminium layers 12, 13 and 14 each have a thickness of approximately 1 micron and the silicon oxide layer 7 has a maximum thickness of approximately 2 microns, it being understood that due to the planar diffused processing various parts of the layer 7 will be of different thickness.

Figure 3:
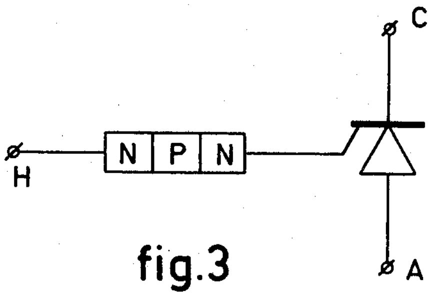
FIGURE 3 is a schematic form of the integrated circuit shown in FIGURES 1 and 2.

The regions 1, 2, 3, 4 between the contacts 13 and 1 and the three p-n junctions $J_1$, $J_2$, $J_3$ therebetween constitute the main current path of a transverse thyristor, the contacts 13 and 15 constituting the main current carrying electrodes and respectively constituting the cathode and the anode of the transverse thyristor. In a normal planar type of thyristor the gate electrode would be provided on the region 2 but in the integrated circuit shown in FIGURES 1 and 2 there is no external contact to the region 2, the ohmic contact 14 on the n-type region 11 constituting a control electrode. A lateral three-layer trigger diode having symmetrical characteristics is present which is constituted by the three successively arranged regions of alternating conductivity type near the surface 6 consisting of the n-type region 11, the p-type region 2 intermediate the n-type regions 10 and 11, and the n-type region 10. The integrated circuit may be represented as shown in FIGURE 3 as a triode thyristor having a three region, two-terminal, three-layer NPN trigger diode in series with the gate. Thus a triggering current path is provided extending substantially parallel to the surface 6 through the lateral diode constituted by the regions 11, 2 and 10 between the control electrode 14 and the region 2 of the transverse thyristor. In FIGURE 3 the contact 13, the cathode, is designated C, the contact 15, the anode, is designated A, and the control electrode 14 is designated H. The lateral trigger diode provides for switching the transverse thyristor formed by the four regions 1, 2, 3 and 4 and the three p-n junctions $J_1$, $J_2$ and $J_3$ therebetween from a high impedance, non-conductive stage to a low impedance, conductive state at a suitable applied voltage to the control electrode with respect to the cathode voltage. This integrated circuit can be employed, for example in some motor speed control and power control circuits.

The operation of the integrated circuit is as follows: When the applied voltage between the anode and cathode of the transverse thyristor is such that the thyristor is in the forward direction in a high impedance, non-conductive state, the junctions $J_1$ and $J_3$ are forward biased and the junction $J_2$ reverse biased. A depletion layer will be associated with the reverse biased junction $J_2$. When the applied voltage on the control electrode is made positive with respect to the cathode the junction $J_\alpha$ is forward biased and the junction $J_\beta$ is reverse biased. As this voltage becomes more positive with respect to the cathode the overall breakdown voltage of the lateral NPN diode (11, 2, 10) is reached, for example at a positive voltage of 10 volts on the control electrode with respect to the cathode. Electrons are emitted into the p-type region 2. Some of these electrons flow between the n-type regions 10 and 11 and some diffuse across the p-type region 2 and are accelerated across the depletion layer of $J_2$ and then diffuse across the n-type region 3 to give rise to the emission of holes across $J_3$ from the p-type region 4 into the n-type region 3. These holes will be accelerated across the depletion layer of $J_2$ and some reach $J_1$ and give rise to the emission of electrons from the n-type region 1 into the p-type region 2. Thus the transverse thyristor is turned on by the normal regenerative process and switched to a low impedance conductive state.

Figure 4:
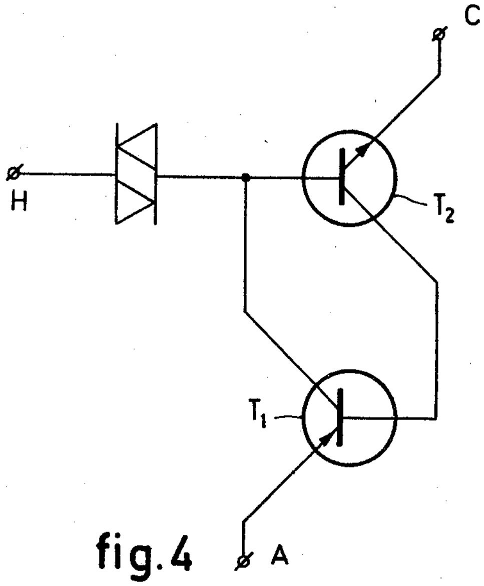
FIGURE 4 is a representation of the equivalent circuit of the integrated circuit shown in FIGURES 1 and 2.
Figure 7:
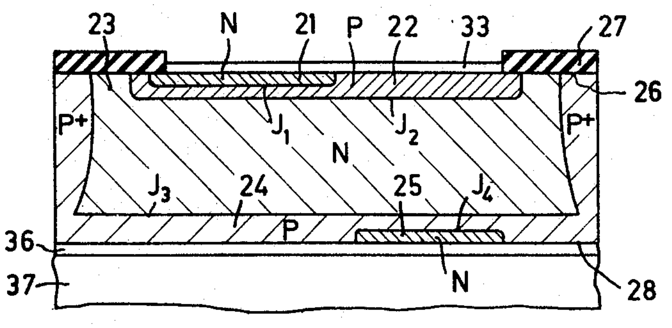
Figure 8:
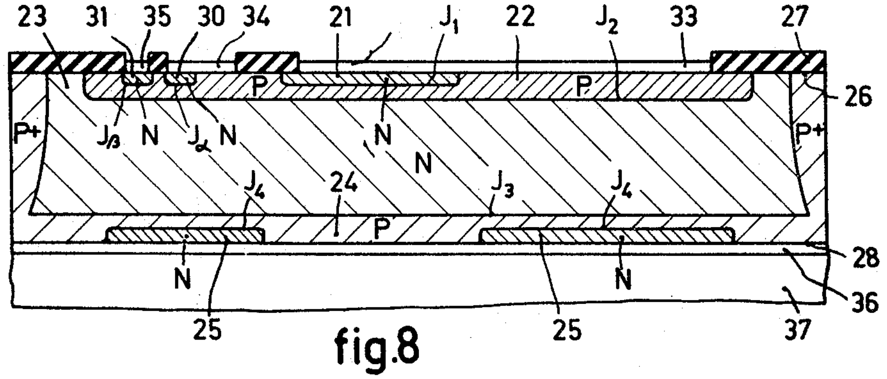

FIGURE 4 shows an equivalent circuit of the integrated circuit shown in FIGURES 1 and 2. It is common practice to represent a four layer thyristor as two transistors $T_1$ and $T_2$ in which the base of the P-N-P transistor $T_1$ is connected to the collector of the N-P-N transistor $T_2$ and the collector of the P-N-P transistor $T_1$ is connected to the base of the N-P-N transistor $T_2$. FIGURE 4 shows the transistors $T_1$ and $T_2$ of the transverse thyristor constituted by the four regions 1, 2, 3 and 4, the cathode C of the transverse thyristor being the ohmic contact 13 on the region 1 which is the emitter of the N-P-N transistor $T_2$ and the anode A of the transverse thyristor being the ohmic contact 15 on the region 4 which is the emitter of the P-N-P transistor $T_1$. The lateral three-layer NPN trigger diode is connected in series with the base of the N-P-N transistor $T_2$.

The operation of the integrated circuit with respect to the triggering of the transverse thyristor ($T_1$ and $T_2$) by the lateral three-layer NPN diode will now be described with reference to the equivalent circuit shown in FIGURE 4.

The condition of interest is when the thyristor is biased in the forward direction that is, the anode is at a positive voltage with respect to the cathode. If a positive voltage is applied to the control electrode which is less than the breakdown voltage of the NPN symmetrical diode no current will flow to the base of $T_2$ and $T_1$ and $T_2$ will remain in the off-state. If the positive voltage applied to the control electrode H is greater than the breakdown voltage of the NPN diode a current will flow through the diode to the base of transistor $T_2$. This will give rise to a collector current in $T_2$ which will flow to the base of $T_1$. $T_1$ and $T_2$ will then turn-on in the normal regenerative manner.

The semiconductor integrated circuit shown in FIGURES 5 to 8 includes a bidirectional thyristor. The semiconductor body comprises a first, n-type region 21, a second, p-type region 22, a third, n-type region 23, a fourth, p-type region 24 and a fifth, n-type region 25. The semiconductor body has a substantially plane surface 26 having an adherent protective insulating layer 27 of silicon oxide thereon and an opposite substantially plane surface 28. The first, n-type region 21 is a diffused region and is surrounded within the body by the second, p-type region 22 which is also a diffused region. The p-n junction $J_1$ between the first and second regions terminates at the surface 26 with part of the junction terminating below the silicon oxide layer 27. The second, p-type region 22 is surrounded within the body by the third, n-type region, the p-n junction $J_2$ between these regions also terminating at the surface 26 below the silicon oxide layer 27. The fourth, p-type region 24 is a diffused region and extends in the body from the opposite surface 28. The region 24 further extends to the surface 26 at the periphery of the body such that the p-n junction $J_3$ between the third and fourth regions 23 and 24 respectively also terminates at the surface 26 below the silicon oxide layer 27. The fifth, n-type region 25 extends in the body from the surface 28 and is surrounded within the body by the fourth n-type region 24, the p-n junction $J_4$ between these regions terminating at the surface 28. Two further regions 30 and 31 which are diffused n-type regions, extend in the body from the surface 26 and are surrounded within the body by the second p-type region 22. The p-n junctions $J_\alpha$ and $J_\beta$ between the regions 30, 31 and the p-type region 22 also terminating at the surface 26. The regions 30 and 31 have the same area at the surface 26 and have the same impurity concentration profile as the region 21, these three diffused n-type regions having been formed simultaneously by the diffusion of a donor element into three limited surface portions of the surface 26. The fifth, n-type region 25 has a first portion which is displaced in the lateral direction of the body with respect to the first, n-type region 21, and a second portion situated opposite the n-type regions 30 and 31. The junction $J_4$ is shown in chain-dot line in FIGURE 5. In the insulating layer 27 there is a common opening exposing the first, n-type region 21 and the second, p-type region 22, this opening containing a metal layer 33 which forms a low resistance common ohmic contact to these regions, the contact shorting part of the junction $J_1$ at the surface 26. In a further common opening exposing the n-type region 30 and the p-type region 22 where part of the periphery of the p-n junction $J_\alpha$ terminates at the surface 26 there is a metal layer stripe 34 which effectively shorts part of the junction $J_\alpha$ at the surface 26. In an opening in the insulating layer 27 where the n-type region 31 extends to the surface 26 there is a metal layer 35 in ohmic contact with this region. On the opposite surface 28 there is a metal layer 36 which forms a low resistance common contact to the fourth and fifth regions 24 and 25, the contact shorting part of the junction $J_4$ where it terminates at the surface 28. The metal layer 36 is secured to a metal support 37 forming part of the incapsulation of the integrated circuit.

The dimensions of the semiconductor body and the various regions shown in FIGURES 5 to 8 are as follows:

The semiconductor body is of 2.9 mm. x 2.7 mm. x 180 microns thickness. The n-type region 23 has a resistivity of approximately 25 ohm-cm., and its area extending at the surface 26 is 2.3 mm. x 2.5 mm. The p-type region 24 has been formed by a two-stage boron diffusion process and the surface concentration at the surfaces 26 and 28 is $10^{19}$ atoms/cc. The junction $J_3$ has a part extending substantially parallel to the surface 28 at a distance therefrom of 30 microns. The junction $J_2$ has a part extending substantially parallel to the surface 26 at a distance therefrom of 30 microns. The p-type region 22 contains a diffused boron concentration which at the surface 26 is $10^{19}$ atoms/cc., and the area of this region at the surface 26 is 1.9 mm. x 2.1 mm. The n-type regions 21, 30 and 31 all have the same diffused phosphorus concentrations which at the surface 26 is $5\times10^{20}$ atoms/cc. The n-type region 21 has an area at the surface 26 of 0.8 mm. x 1.0 mm. The n-type regions 30 and 31 have the same areas at the surface 26, each of 0.18 mm. x 1.0 mm. The parts of the junctions $J_1$, $J_\alpha$ and $J_\beta$ extending substantially parallel to the surface 26 are at a distance therefrom of 15 microns. The adjoining parts of the junctions $J_\alpha$ and $J_\beta$ where they terminate at the surface 26 are spaced by a distance of 25 microns. The n-type region 25 has a substantially L-shaped area at the surface 28 and the closest parts of the junctions $J_1$ and $J_4$ are spaced in the lateral direction of the body by a distance of 0.1 mm. in accordance with the principle described in the Applicants British Patent No. 1,053,937. The n-type region 25 has a diffused phosphorus concentration which at the surface 28 is $5\times10^{20}$ atoms/cc. The aluminium contact layer 33 has an area of 0.8 mm. x. 1.8 mm. and the aluminium contact layer 35 has an area of 0.14 mm. x 0.95 mm. The shorting aluminium layer 34 has an area of 0.14 mm. x 0.6 mm. The aluminium layers 33, 34 and 35 each have a thickness of approximately 2 microns and the silicon oxide layer 27 has a maximum thickness of approximately 2 microns.

Figure 9:
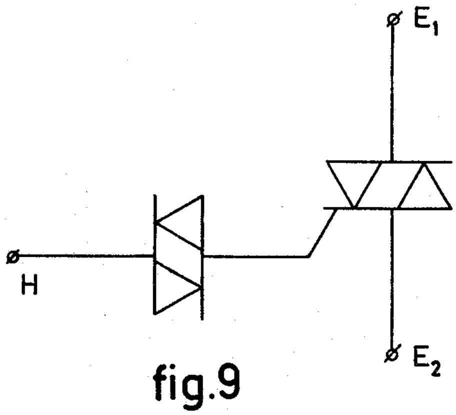
FIGURE 9 is a schematic form of the integrated circuit shown in FIGURES 5 to 8.

The regions 21, 22, 23, 24 and 25 between the contacts 33 and 36 and the four p-n junctions $J_1$, $J_2$, $J_3$ and $J_4$ therebetween constitute the main current paths of a bidirectional thyristor, the contacts 33 and 36 constituting the main current carrying electrodes. The ohmic contact 35 on the n-type region 31 constitutes a control electrode. The integrated circuit may be represented as shown in FIGURE 9 as a bidirectional triode thyristor having a two terminal, three-layer, trigger diode in series with the gate. The trigger diode is constituted by the three successively arranged regions of alternating conductivity type between the control electrode 35 and the region 22, namely the n-type region 31, the p-type region 2 intermediate the n-type regions 31 and 30, and the n-type region 30.

A bidirectional triode thyristor as is known can be turned on by both positive or negative gate signals both in the first quadrant of its characteristic (i.e. $E_1$ is biased positively with respect to $E_2$) and in the third quadrant of its charateristic (i.e. $E_1$ is biased negatively with respect to $E_2$). The NPN diode has symmetrical electrical characteristics and passes a high current if the breakdown voltage is exceeded irrespective of the applied polarity. Thus referring to FIGURE 9, if $E_1$ and $E_2$ are biased so that the thyristor is either in its first or third quadrant and a positive or negative voltage is applied to the control electrode H with respect to electrode $E_2$, then provided this voltage is less than the breakdown voltage of the lateral diode no current will flow to the bidirectional thyristor and it will remain in the high impedance, non-conductive state. If the voltage (positive or negative) applied to the control electrode exceeds the breakdown voltage of the lateral diode, current flows to the bidirectional thyristor and it is switched on to the low impedance state etiher in the first or third quadrant depending upon the bias between $E_1$ and $E_2$.

Figure 10:
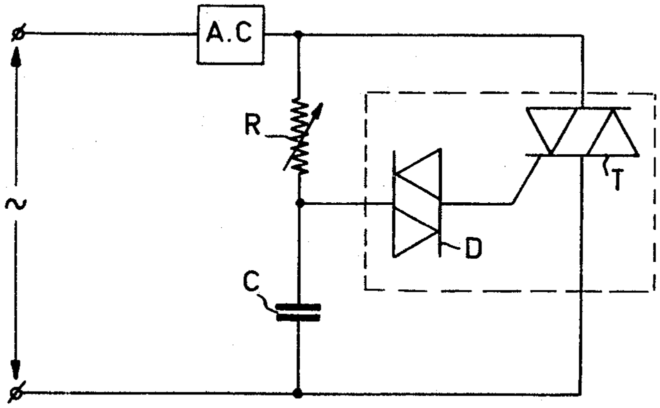
FIGURE 10 shows a known full-wave phase control circuit including a bidirectional triode thyristor and a two-terminal, three-layer trigger diode.

FIGURE 10 shows a circuit arrangement of a full wave phase controlled switch comprising a bidirectional triode thyristor ("Triac") T having a two-terminal, three-layer diode or ("Diac") D connected in series with the gate of the bidirectional triode thyristor. This circuit can be used, for example, for motor speed control and lamp dimming. The capacitor C charges to a voltage which will cause the diode to conduct in a time which is dependent on the setting of the variable resistor R. When the diode D conducts the bidirectional triode thyristor is switched on when a suitable voltage appears at the gate. The integrated circuit shown in FIGURES 5 to 8 can be used in such a circuit to replace the two separate components consisting of the bidirectional triode thyristor ("Triac") and the three-layer diode ("Diac"). This is indicated in FIGURE 10 by these components surrounded by the broken line.

What is claimed is:

1. A semiconductor integrated circuit comprising a semiconductor body having a transverse thyristor formed by first, second, third and fourth successively arranged regions of alternating conductivity type extending between opposite major surfaces of the body and defining three p-n junctions therebetween, two main current carrying electrodes, one of said main electrodes being in ohmic contact with the first region of the one conductivity type at one major surface and the other of said main electrodes being in ohmic contact with the fourth region which is of the opposite conductivity type whereby a main current carrying path is provided between said electrodes through the transverse thyristor formed by said four regions and said three p-n junctions, the said first region being surrounded within the body by the said second region with the p-n junction therebetween terminating at the one surface, first and second further regions of the one conductivity type provided within the body extending from the one surface and both surrounded within the body by the said second region with the p-n junctions therebetween also terminating at the one surface, electrically conductive means on the one surface for shorting the p-n junction between the first further region and the second region along part of its periphery which terminates at the one surface, and a control electrode in ohmic contact with the second further region at the one surface, thereby to provide a lateral, three-layer trigger diode in the series path from the control electrode to the second region of the transverse thyristor for switching the transverse thyristor from a high-impedance, non-conductive state to a low-impedance, conductive state at a suitable applied voltage on the control electrode with respect to the applied voltage on the one main electrode.

2. A semiconductor integrated circuit as claimed in claim 1, wherein the said first region is a diffused region, the said second region is a diffused region and is surrounded within the body by the said third region with the p-n junction therebetween terminating at the one surface, and the shorting means is a metal layer on the surface.

3. A semiconductor integrated circuit as claimed in claim 2, wherein the first region which is of the one conductivity type and the first and second further regions which are also of the one conductivity type are all diffused regions having substantially the same impurity concentration profiles and have been formed simultaneously by the diffusion of an element characteristic of the one conductivity type into limited surface portions of the one major surface.

4. A semiconductor integrated circuit as claimed in claim 2 wherein the said third region is surrounded within the body by the said fourth region with the p-n junction therebetween terminating at the one major surface, said fourth region being a diffused region and extending to the opposite major surface of the body.

5. A semiconductor integrated circuit as claimed in claim 4, wherein the main electrode in contact with the fourth region is situated on the said opposite major surface.

6. A semiconductor integrated circuit as claimed in claim 1 wherein the first and second further regions have substantially the same area at the one surface and have substantially the same impurity concentration profiles such that the lateral, three layer trigger diode has substantially symmetrical characteristics.

7. A semiconductor integrated circuit as claimed in claim 1 wherein the transverse thyristor is a bidirectional thyristor, the semiconductor body comprising a fifth region which is of the one conductivity type and which extends in the body from the major surface opposite to the said one major surface and is surrounded within the body by the fourth region with the p–n junction therebetween terminating at the said opposite major surface, the first and fifth regions being displaced relative to each other in the lateral direction of the body and the fifth region having a portion extending opposite the first and second further regions, the one main electrode forming a common contact to the first and second regions at adjoining exposed portions thereof at the one major surface and the other main electrode forming a common contact to the fourth and fifth regions at adjoining exposed portions thereof at the opposite major surface.

References Cited

UNITED STATES PATENTS

| | | | |
|---|---|---|---|
| 3,271,201 | 9/1966 | Pomerantz | 148—33.3 |
| 3,299,307 | 1/1967 | Inoue | 313—108 |
| 3,419,765 | 12/1968 | Clark et al. | 317—234 |
| 3,423,650 | 1/1969 | Cohen | 317—234 |

JOHN W. HUCKERT, Primary Examiner

S. BRODER, Assistant Examiner

PO-1050
(5/69)

UNITED STATES PATENT OFFICE
CERTIFICATE OF CORRECTION

Patent No. 3,508,157 Dated April 21, 1970

Inventor(s) Ralph C. Mobley

It is certified that error appears in the above-identified patent and that said Letters Patent are hereby corrected as shown below:

Column 3, line 50, that portion of the formula reading $\left(\frac{T}{t}\right)$ should read $\left(\frac{T}{t}\right)^2$

SIGNED AND
SEALED
AUG 18 1970

(SEAL)
Attest:

Edward M. Fletcher, Jr.
Attesting Officer

WILLIAM E. SCHUYLER, JR.
Commissioner of Patents